United States Patent [19]

Field

[11] Patent Number: 4,468,814
[45] Date of Patent: Aug. 28, 1984

[54] RADIO CHANNEL VISUAL IDENTIFICATION SYSTEM

[75] Inventor: Robert C. Field, Dollard des Ormeaux, Canada

[73] Assignee: Canadian National Railway Company, Montreal, Canada

[21] Appl. No.: 385,305

[22] Filed: Jun. 4, 1982

[30] Foreign Application Priority Data

Jun. 8, 1981 [GB] United Kingdom ............... 8117438

[51] Int. Cl.³ .................. H04B 1/16; G08B 5/38
[52] U.S. Cl. .................... 455/159; 455/77; 340/331; 340/332; 340/701; 246/191
[58] Field of Search ............ 455/77, 62, 158, 159; 340/32, 331, 332, 701, 711, 825, 37; 246/191

[56] References Cited

U.S. PATENT DOCUMENTS

| | | |
|---|---|---|
| 2,448,713 | 9/1948 | Hansell . |
| 3,594,776 | 7/1971 | Wildgruber .......................... 340/332 |
| 3,750,138 | 7/1973 | Burgan et al. ...................... 340/332 |
| 3,810,150 | 5/1974 | Jacobs ................................ 340/331 |
| 3,867,573 | 2/1975 | Birkin ................................ 340/332 |
| 3,909,822 | 9/1975 | Lee et al. ........................... 340/331 |
| 3,968,436 | 7/1976 | Hajek et al. . |
| 4,112,376 | 9/1978 | Fosnough et al. . |
| 4,264,979 | 1/1979 | Gutowski ............................ 455/77 |

FOREIGN PATENT DOCUMENTS 73690 6/1977 Japan ................................... 455/159

*Primary Examiner*—Jin F. Ng
*Attorney, Agent, or Firm*—Larson & Taylor

[57] ABSTRACT

A visual identification system for a multi-channel radio having a channel selector switch is provided which produces a flashing light visible in all directions identifying the selected radio channel. The visual identification system comprises a plurality of lights, each light having a different color, mounted in a visible location in close association with each other. A light selector circuit selects one of the colored lights to flash and a flash selector circuit selects a predetermined number of flashes for the particular light as determined by a decoder in response to a particular channel selection.

14 Claims, 2 Drawing Figures

RADIO CHANNEL VISUAL IDENTIFICATION SYSTEM

The present invention relates to a visual identification system for multi-channel radios. More particularly, the present invention provides a light identification to show which channel of a multi-channel transmitter-receiver radio is in use.

Multi-channel transmitter-receiver radios are used in many applications today. The advantage of having different channels is to avoid interference if too many users are using a single channel. High power transmitters override and blank out lesser powered transmitters and air time sharing is both bothersome and affects performance, thus multi-channel transmitter-receiver radios are used with particular channels assigned to particular sections or crews.

One particular use of multi-channel radios is in railway freight yards. Switching crews in yard engines are controlled from a control tower and radios are used so the crews can talk to each other and to the control tower in the operation of the freight yard. The use of radios replaces hand signals with verbal instructions and enables supervisory coverage of the freight yard operation.

Freight yards, however, have become larger and it is now found that three or four yard engines operate in one section of the yard and the crews communicate with each other and the control tower on one frequency channel whereas in another section of the yard a second frequency channel is used. This can lead to confusion from time to time, because the control tower is not always sure on what frequency channel a particular yard engine is switched to and, therefore, is not sure exactly how to communicate with the crew in that engine without switching from channel to channel until the right one is found. This could lead to dangerous situations in an emergency when it is essential that a particular freight engine be stopped immediately to avoid an accident which cannot be seen by the crew in the engine cab. Furthermore, yard crews on foot may have mobile radios and if they wish to communicate with a particular yard engine, they do not know on what frequency channel the yard engine is switched to and, therefore, have to switch from channel to channel until the right one is found.

It is a purpose of the present invention to provide a system wherein a multi-channel transmitter-receiver radio has a visual identification so that anyone observing the vehicle having the radio, or the radio itself can immediately identify which frequency channel of the multi-channel radio is being used and is being monitored.

In railroad, airline or other transportation companies, many thousands of radio units are used. Generally, these units have specific frequency channels assigned for different operations. In the case of a railroad, such different operations include maintenance of the railroad, communication with trains en route, car control, equipment maintenance, police and intermodal departments. All of these operate on different frequency channels and it is important that they do not overlap with each other, otherwise the communications become confused. Some of the present uses of radios in a railroad include the updating of work programs to work crews, giving and receiving instructions directly related to movements, coordination of several yard engines in a freight yard or in a specific freight area, keeping all crew members informed of all signals and slow orders which affect train movements. One of the most important uses of the radio is to call for help when emergencies arise.

Radio channel display devices for CB radios, such as those shown in U.S. Pat. No. 4,112,376 to Fosnough et al and U.S. Pat. No. 4,264,979 to Gutowski, are known. These devices are suitable for a CB radio in a car and have a digital display panel indicating the channel in use. Such devices, however, have very limited viewing range and can only be seen from one position.

A visual identification system to identify individual radio frequency channels is provided by the present invention so that outside observers can identify which specific channel a radio operator is using. In the case of a railroad engine, roof display lights are provided on the engine, and the lights can be seen from anywhere around the engine. The lights are positioned so that viewers can see them in a 360° circle. These lights may be different colour lights and may also flash to identify a specific radio frequency channel. It is found that flashing display lights are easily visible for up to 1500 meters or more in daylight. Such distances are necessary in large freight yards. In one example, three coloured lights are used, red, white and blue, and flashing occurs on each one of these colours, either one to four flashes, thus a total of twelve channels can be identified and the particular channel being used is seen from observing the colour and number of flashes from the lights on top of the engine.

The present invention provides in a multi-channel radio having a radio frequency channel selector switch, a visual identification system to indicate which radio frequency channel is in use, comprising, a plurality of lights, each light having a different colour, mounted in a visible location in close association with each other, a light selector means to select one of the plurality of coloured lights to flash, a flash selector means to select a predetermined number of flashes for the particular light, and an interconnect from the channel selector switch to a channel selector decode means which decodes a particular channel selection and signals the light selector means and flash selector means representing the particular channel selection.

Also provided in one embodiment of the present application is a 12-channel radio with three coloured lights, the flash selector selects up to four flashes followed by a pause between each series of flashes. In another embodiment of the invention, each flash and each interval between each flash is in the range of about 1 to 2 seconds, and the pause between each series of flashes is in the range of about 3 to 5 seconds.

By using this system, and by adopting a verbal code describing the particular light colour and number of flashes, it will be possible not only to listen to the radios switched to that particular channel but also to observe which engines or radios are operating on that channel. For instance, if the channel is identified as two flashes of the red light, then its code name would be "Red 2" and any listener hearing the code "Red 2" would merely have to observe all engines and radios which had a red light flashing twice to be able to identify which radios were switched to that particular channel.

Whereas this specification describes radios used in railroad engines and hand-carried by maintenance and yard crews, it will be apparent that radios and visual identification lights could be employed in almost any type of vehicle or mobile units in any location where multi-channel radios are used and where it is necessary to identify the particular channel being used by a certain group or section of people. Various changes may be made to the system without departing from the scope of the present invention.

In drawings which illustrate embodiments of the invention,

Figure 1:
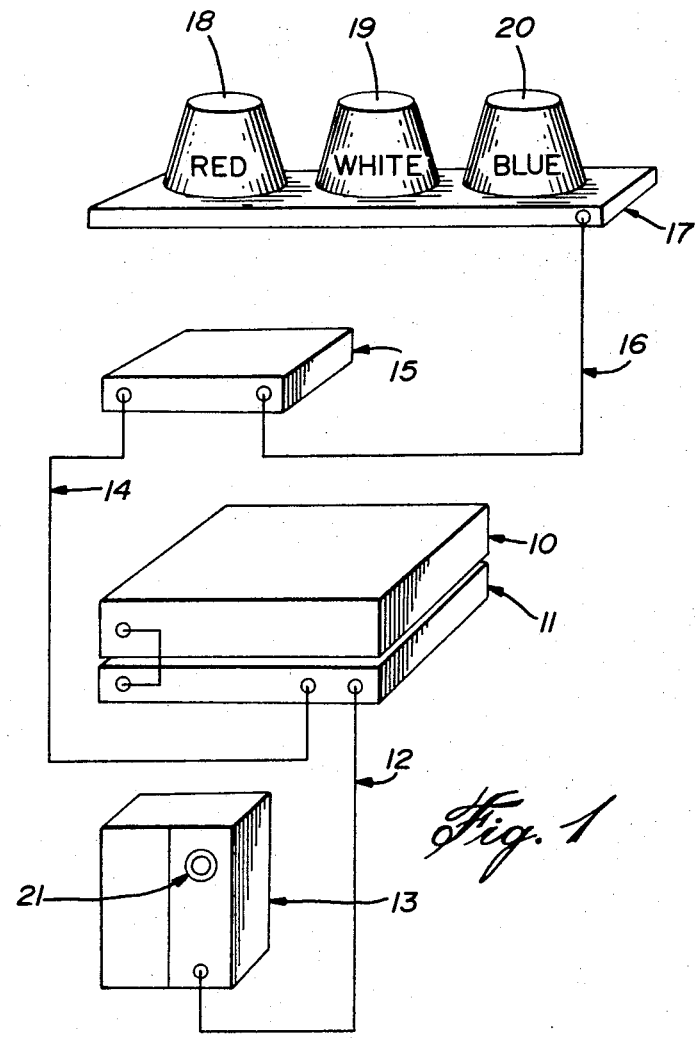
FIG. 1 is a schematic outline of a visual identification system for a multi-channel radio.

Referring now to FIG. 1, a standard multi-channel transmitter-receiver radio 10 is shown mounted on a radio mounting base 11 having a multiplex connector lead 12 to a remote radio control head 13 with a microphone and speaker therein. A multiplex interconnect 14 from the radio mounting base 11 feeds to an identification light control unit 15. Leads 16 from this light control unit 15 connect to a mounting panel 17 having lights of different colours, such as a red light 18, a white light 19, and a blue light 20.

The radio control head 13 has a selector switch 21 for selecting a particular radio frequency channel. As well as selecting the radio channel, the electronic information is made available from the mounting base 11 through the interconnect 14 to the light control unit which automatically selects the number of flashes and the colour representing the selected channel and flashes the appropriate light for the appropriate number of flashes.

Figure 2:
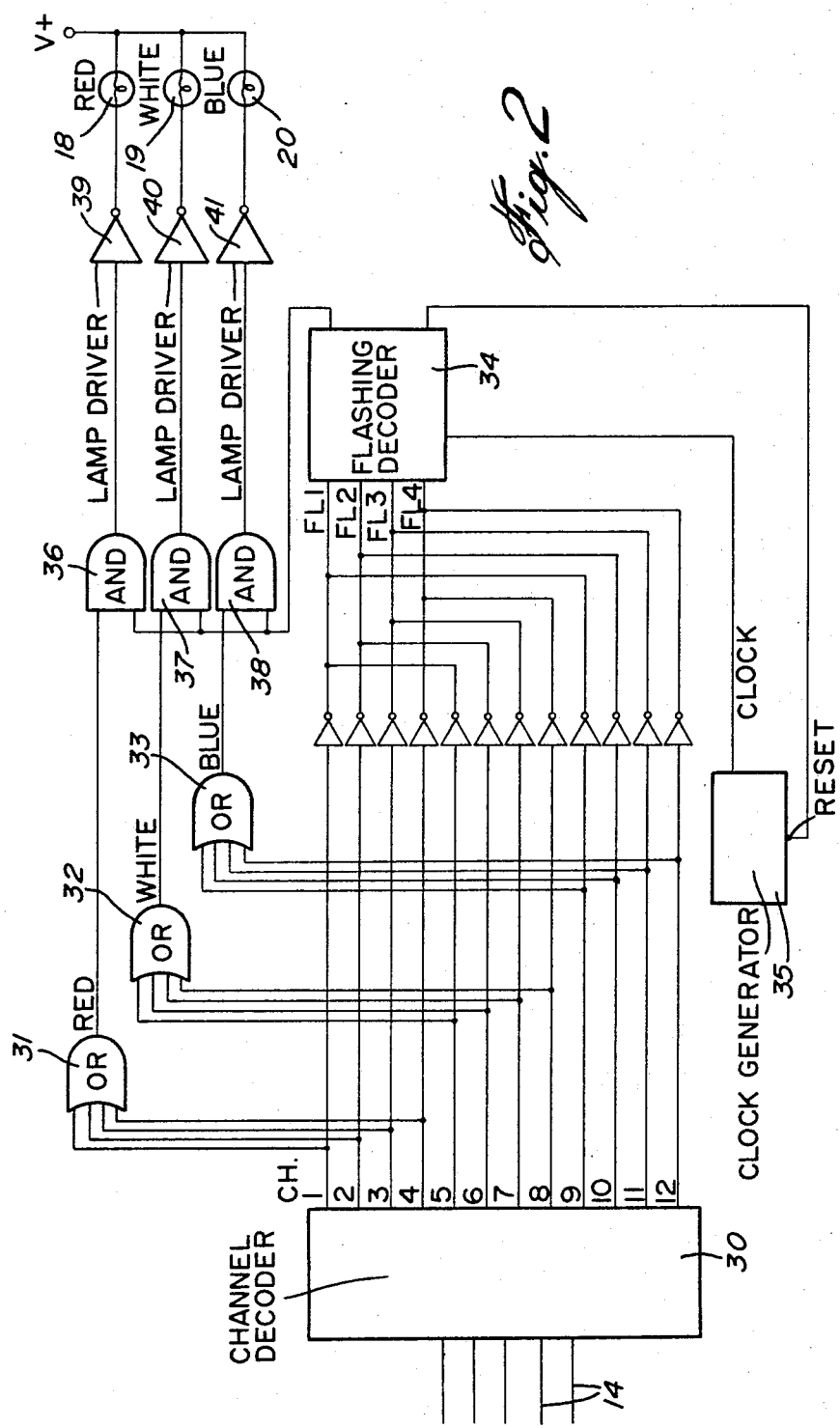
FIG. 2 is a schematic diagram of an identification light control unit.

In one embodiment shown in FIG. 2, the interconnects 14 feed the signal representing the selected signal to a channel decoder 30 in the identification light control unit 15 which decodes the signal to one of twelve channels which feed through an OR gate 31 to 33 representing the colour selection and a flashing decoder 34 having a clock generator 35 to produce the pulse times for flashes and intervals as well as the long pause or eclipse time for resetting between a series of flashes. The pulses are signalled to AND gates 36 to 38 so that the correct light is signalled through lamp driver relays 39 to 41 thus lighting the correct coloured light 18 to 20 and produce the correct series of flashes. In the case of a locomotive, the roof display lights are powered from the locomotive battery from connections in the radio mounting base 11.

In use, if an operator is told to use channel "Red 2", then he places the channel selector switch 21 on the radio control head 13 to this channel, and the identification light control unit 15, using the electronic signal from the mounting base 11, automatically and repeatedly flashes the red light 18 twice. Each series of flashes is followed by a predetermined long pause or eclipse, thus anyone observing the unit and seeing the light is immediately aware that the unit is tuned to channel "Red 2".

The flashing lights represent an information source rather than an alarm signal, and after field testing it was found that the preferred interval for a flash was from 1.2 to 1.7 seconds, the preferred interval between flashes was also from 1.2 to 1.7 seconds, and the long pause or eclipse between each series of flashes was preferably 3 to 5 seconds. These times proved the most easy to read for observers in the field.

In the case of a freight yard, yard engines are allotted a separate frequency channel for their own use to a limit of channels available in the radio 10, and the light identification on the roof indicates the particular frequency channel to which the radio is tuned. In the same way, a control tower above the freight yard has a similar visual identification system attached thereto so crews in the yard engines and on foot see immediately what channel the control tower is monitoring or using at a particular time. Thus, if there is a need for a yard engine, even of another channel, to speak to the control tower, he merely has to switch his own channel to that of the control tower and then can communicate with the tower.

Selection of the lights depends on the requirements. In the case of a yard engine, the flashes are sufficiently bright so that they can be seen from one end of the freight yard to the other. It has been found that globe lights similar to those used for navigation purposes on ships, can be seen for 360° around the display and for distances of up to 1900 meters in daylight.

Whereas the example illustrated herein has three lights and the radio has twelve channels, it will be apparent to those skilled in the art that more lights and channels could be utilized. It is generally found that four flashes is about the maximum number of desirable flashes, otherwise the problem of counting flashes can become time-consuming and mistakes can be made.

Whereas the system has been described mounted on a yard engine in a freight yard, it will be appreciated that the application can be used for other uses than railroads. Road vehicle loadings, container storage areas, shipping operations in the harbour are but some of the many uses to which this system may be applied.

The embodiments of the invention in which an exclusive property or privilege is claimed are defined as follows:

1. In a multi-channel radio having a radio frequency channel selector switch to select one of a plurality of channels, a visual identification system to indicate which radio frequency channel is in use, comprising,
    a plurality of lights the number of which is less than the number of selectable channels, each light having a different colour,
    means for mounting said lights in a visable location in close association with each other,
    a light selector means to select only one of the plurality of coloured lights to flash,
    a flash selector means to select a predetermined number of flashes for the selected light, and
    means for interconnecting the channel selector switch to a channel selector decode means which decodes a particular channel selection and signals the light selector means and flash selector means representing the particular channel selection whereby the identity of the selected channel is indicated by the colour of the light and the number of light flashes.

2. The visual identification system according to claim 1 wherein the radio has twelve frequency channels, three coloured lights are provided, and the flash selector selects up to four flashes followed by a pause between each series of flashes.

3. The visual identification system according to claim 2 wherein each flash lasts from about 1 to 2 seconds, each interval between flashes last from about 1 to 2 seconds and the pause between each series of flashes is from about 3 to 5 seconds.

4. A visual identification system for a multi-channel radio having a channel selector switch for selecting one of a plurality of channels, the system for indicating which channel has been selected and comprising:

a plurality of lights less in number than the number of selectable channels, each light having a different colour;

means for mounting said lights in close association with each other;

channel selector decode means for decoding the selected channel;

light selector means coupled to said decode means for selecting only a predetermined one of said lights based on the decoded output of said decode means;

flash selector means coupled to said decode means for selecting a predetermined number of flashes by generating a pulse train of signals equal to the number of flashes, said selected number of flashes based on the decoded output of said decode means;

and gate means connected to said light selector means and said flash selector means for coupling said pulse train of signals to the selected light for periodically energizing the selected light whereby the identity of the selected channel is indicated by the colour of the light and the number of light flashes.

5. The visual identification system as claimed in claim 4 wherein each light has a visability of up to at least 1900 meters in daylight.

6. The visual identification system as claimed in claim 5 wherein each light has a 360° arc of visability.

7. The visual identification system as claimed in claim 4 wherein each light has a 360° arc of visability.

8. The visual identification system as claimed in claim 4 wherein said mounting means mounts said lights at a location and wherein said lights have a light strength so as to be visable at least 1900 meters.

9. The visual identification system as claimed in claim 4 wherein said pulse train has a plurality of pulse groups, each pulse group having at least one pulse of a predetermined pulse width, and each pulse group being separated by a distinct time interval.

10. The visual identification system as claimed in claim 9 wherein the radio has 12 channels; wherein three coloured lights are provided; and wherein each pulse group has the same number of pulses, said number being from one to four.

11. The visual identification system as claimed in claim 10 wherein the pulse width is from about 1 to 2 seconds; wherein the time between pulses in the same pulse group is from about 1 to 2 seconds; and wherein the time interval between pulse groups is from about 3 to 5 seconds.

12. The visual identification system as claimed in claim 11 wherein the pulse width is from 1.2 to 1.7 seconds; and wherein the time between pulses in the same pulse group is 1.2 to 1.7 seconds.

13. The visual identification system as claimed in claim 9 and further comprising a single clock generator connected to said flash selector means, said clock generator generating a pulse train of clock pulses and said flash selector means selecting out a predetermined number of clock pulses to form said pulse group.

14. The visual identification system as claimed in claim 4 wherein said mounting means is for mounting said lights to the roof of a locomotive having a battery; and further including means for connecting said system to the locomotive battery for powering said system.

* * * * *